(12) United States Patent
Campiglio et al.

(10) Patent No.: US 10,753,989 B2
(45) Date of Patent: Aug. 25, 2020

(54) MAGNETORESISTANCE ELEMENT WITH PERPENDICULAR OR PARALLEL MAGNETIC ANISTROPY

(71) Applicant: Allegro MicroSystems, LLC, Manchester, NH (US)

(72) Inventors: Paolo Campiglio, Arcueil (FR); Amal Hamdache, Limours (FR)

(73) Assignee: Allegro MicroSystems, LLC, Manchester, NH (US)

( * ) Notice: Subject to any disclaimer, the term of this patent is extended or adjusted under 35 U.S.C. 154(b) by 42 days.

(21) Appl. No.: 16/113,321

(22) Filed: Aug. 27, 2018

(65) Prior Publication Data

US 2020/0064413 A1   Feb. 27, 2020

(51) Int. Cl.
*G01R 33/02* (2006.01)
*G01R 33/09* (2006.01)

(52) U.S. Cl.
CPC ....... *G01R 33/0206* (2013.01); *G01R 33/093* (2013.01); *G01R 33/098* (2013.01)

(58) Field of Classification Search
CPC ...... G01R 33/098; G01R 33/093; H01L 43/08
See application file for complete search history.

(56) References Cited

U.S. PATENT DOCUMENTS

| | | | |
|---|---|---|---|
| 9,529,060 B2 | 12/2016 | Fermon et al. | |
| 9,812,637 B2 | 11/2017 | Fermon et al. | |
| 2006/0218775 A1* | 10/2006 | Carey | B82Y 10/00 29/603.14 |
| 2007/0121249 A1* | 5/2007 | Parker | H03K 19/166 360/123.1 |
| 2009/0027048 A1* | 1/2009 | Sato | H01L 27/22 324/247 |
| 2011/0062537 A1* | 3/2011 | Oh | B82Y 25/00 257/421 |
| 2011/0069413 A1* | 3/2011 | Maat | B82Y 10/00 360/234.3 |
| 2014/0175574 A1* | 6/2014 | Watts | H01L 29/82 257/421 |
| 2020/0033424 A1 | 1/2020 | Campiglio et al. | |

OTHER PUBLICATIONS

Taiwan 1st Office Action (with English Translation) dated May 28, 2020 for Taiwan Application No. 108127885; 20 Pages.

* cited by examiner

*Primary Examiner* — Alvaro E Fortich
(74) *Attorney, Agent, or Firm* — Daly, Crowley, Mofford & Durkee, LLP

(57) ABSTRACT

A magnetoresistance structure includes a first magnetoresistance element and a second magnetoresistance element, wherein the first magnetoresistance element is formed on a surface of the second magnetoresistance element. The first magnetoresistance element comprises a free layer, a bias stack configured to bias a magnetic alignment of the free layer to a first direction in the absence of an external magnetic field, and a reference stack having a reference direction substantially orthogonal to the first direction. The magnetoresistance structure may be used to form a two- or three-dimensional magnetic field sensor.

23 Claims, 6 Drawing Sheets

MAGNETORESISTANCE ELEMENT WITH PERPENDICULAR OR PARALLEL MAGNETIC ANISTROPY

FIELD

This disclosure relates to magnetoresistance elements.

BACKGROUND

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In certain applications, magnetic field sensors include magnetoresistance elements. These elements have an electrical resistance that changes in the presence of an external magnetic field. Spin valves are a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

SUMMARY

In an embodiment, a magnetoresistance element includes a free layer, a bias stack configured to bias a magnetic alignment of the free layer to a first direction in the absence of an external magnetic field, and a reference stack having a reference direction substantially orthogonal to the first direction.

In another embodiment, a magnetoresistance structure includes a first magnetoresistance element and a second magnetoresistance element, wherein the first magnetoresistance element is formed on a surface of the second magnetoresistance element. The first magnetoresistance element comprises a free layer, a bias stack configured to bias a magnetic alignment of the free layer to a first direction in the absence of an external magnetic field, and a reference stack having a reference direction substantially orthogonal to the first direction.

In another embodiment, a three-dimensional magnetic field sensor comprises a substrate having a surface and a first magnetoresistance structure supported by the surface of the substrate. The first magnetoresistance structure comprises a first magnetoresistance element having an axis of maximum sensitivity substantially perpendicular to the surface and a second magnetoresistance element having an axis of maximum sensitivity substantially parallel to the surface. A second magnetoresistance structure supported by the surface of the substrate is also included. The second magnetoresistance structure comprises a third magnetoresistance element having an axis of maximum sensitivity substantially perpendicular to the surface and a fourth magnetoresistance element having an axis of maximum sensitivity substantially parallel to the surface. The first and second magnetoresistance structures are positioned on the substrate so that the axis of maximum sensitivity of the fourth magnetoresistance element is substantially perpendicular to the axis of maximum sensitivity of the second magnetoresistance element.

In another embodiment, a magnetoresistance structure comprises means for sensing a magnetic field in two or more dimensions

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a tunneling magnetoresistance (TMR) element, also known as magnetic tunnel junction (MTJ) and a giant magnetoresistance (GMR) element. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
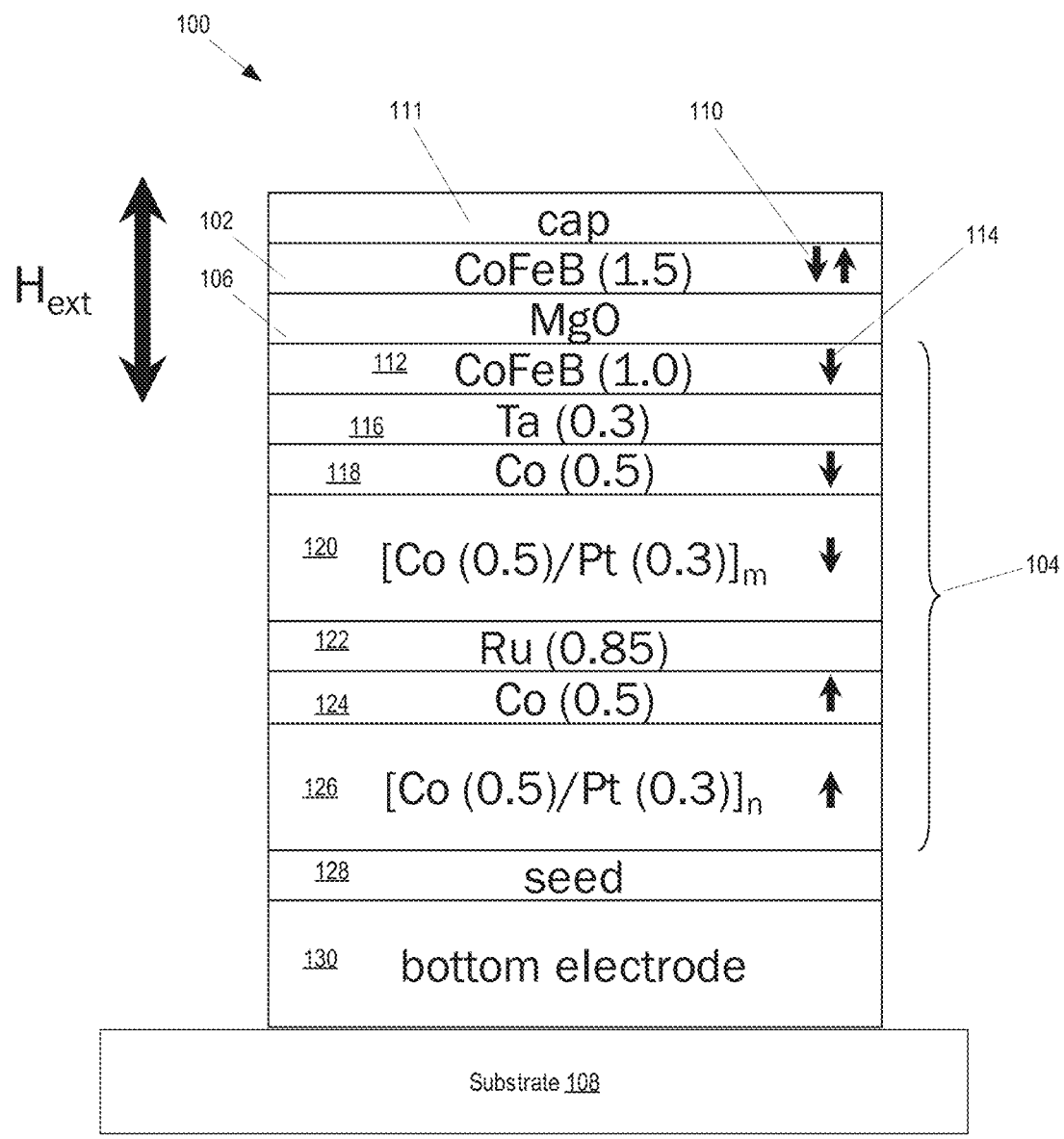
FIG. 1 is a block diagram of a single pinned perpendicular tunneling magnetoresistance (TMR) element.

FIG. 1 is a block diagram of a magnetoresistance element 100, which comprises a plurality of material layers stacked on top of one another. Each of the material layers in the stack has electrical and magnetic properties which, when placed together, cause magnetoresistance element 100 to react to external magnetic fields. Magnetoresistance element 100 is supported by substrate 108. In embodiments, substrate 108 is a semiconductor substrate that supports integrated circuits. In other embodiments, substrate 108 may be any type of material capable of supporting magnetoresistance element 100.

Magnetoresistance element 100 is a spin valve device. Thus, the electrical resistance of magnetoresistance element 100 changes as the magnetic alignment between different material layers changes.

Simple spin valves minimally have two layers: a fixed (also referred to as a reference) layer having a fixed magnetic alignment and a free layer having a magnetic alignment that changes in response to an external magnetic field. When the magnetic alignment of the free layer is lined up with the magnetic alignment of the reference layer, the electrical resistance of the spin valve has a minimal value. Conversely, when the magnetic alignment of the free layer is aligned in an opposite direction to the reference layer, the electrical resistance of the spin valve is at a maximum value. At points in between, the resistance is at an intermediate value. Generally, as the magnetic alignment of the free layer changes from one extreme (e.g. oppositely aligned with the reference layer) to the other extreme (e.g. aligned with the reference layer), the electrical resistance of the spin valve changes linearly from its maximum value to its small value.

Spin valve 100 includes a free layer 102. Instead of a reference layer, spin valve 100 has a reference stack 104 with a plurality of layers that act as a reference layer. Between free layer 102 and reference stack 104 is a spacer layer 106 that separates the free layer from the reference stack, in part so that the magnetic alignment of free layer 102 can "spin" without being influenced by the magnetic alignment of reference stack 104.

Magnetoresistance element 100 is a perpendicular tunneling magnetoresistance (TMR) element. As such, the magnetic alignment of free layer 102 is generally perpendicular to substrate 108 and can spin from a direction opposite to the substrate to a direction toward the substrate (as indicated by arrows 110). Reference stack 104 has a magnetic alignment toward substrate 108. Thus, when free layer 102 spins so its magnetic alignment points toward substrate 108, magnetoresistance element 100 has a small electrical resistance, and when free layer 102 spins so that its magnetic alignment points away from substrate 108 magnetoresistance element 100 has a maximum electrical resistance. Perpendicular alignment may be achieved by decreasing the thickness of the ferromagnetic layers. By doing so, the interface between free layer 102 and the pinned layer may override the natural magnetic direction of the free layer and cause the magnetization of the free layer to change to an out-of-plane (e.g. perpendicular) direction. This may be due to Spin Reorientation Transition effects.

Spacer layer 106 is an insulative material. Electrical current tunnels through spacer layer 106. When the magnetic directions of free layer 102 and reference stack 104 are aligned, more electrons can tunnel through free layer 106, thus the resistance is relatively low. Conversely, when the magnetic directions of free layer 102 and reference stack 104 are in opposite directions, electrons face a greater resistance to tunneling through spacer layer 106, and thus the electrical resistance of magnetoresistance element 100 is high.

In the example shown in FIG. 1, free layer 102 is a CoFeB layer and spacer layer 106 is MgO. Reference stack 104 comprises a pinned layer 112 with a fixed magnetic direction toward substrate 108 (as shown by arrow 114). Reference stack 104 also includes layers 116-126. Layers 126/112 may form a SAF arrangement. Layers 126 and 125 may form the pinned layer. Layer 122 may be the SAF spacer. Layers 120,118,116,112 may form the reference layer. Pt/Co multilayers may be used to achieve perpendicular magnetization. These may be connected through Co layers. CoFeB may be positioned close to the MgO layer to allow MgO crystallization.

Seed layer 128 is generally an electrically conductive layer on which supports the other layers of magnetoresistance element 100, and electrode 130 is a conductive electrode layer that can be used to make electrical connections to other circuits (e.g. integrated circuits supported by substrate 108).

The TMR element 100 can be driven with a current that flows between the bottom electrode 130 and the cap 111. Unlike many types of TMR elements, the TMR element 100 can be responsive to external magnetic fields in a direction of an arrow labeled Hext.

Figure 2:
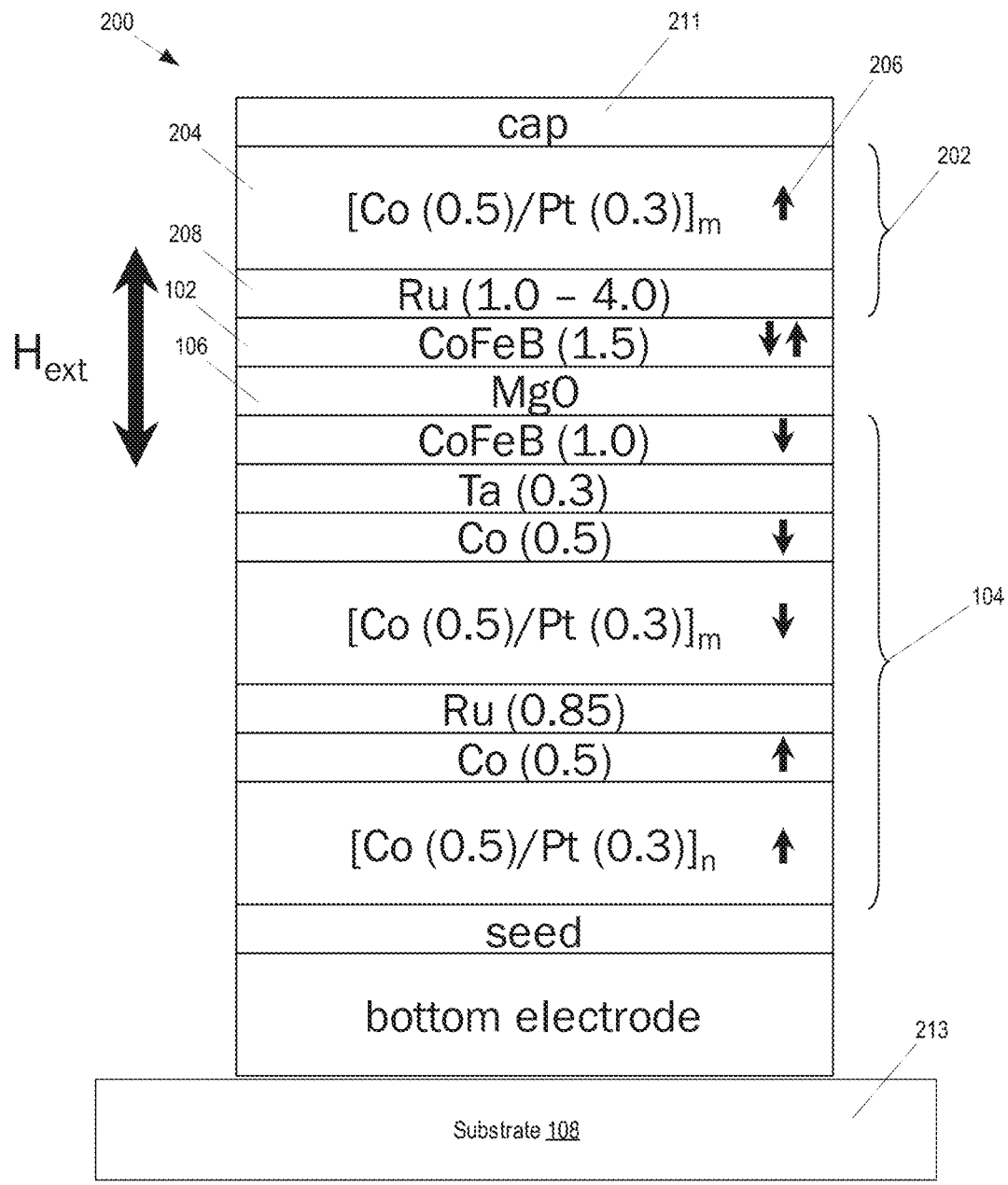
FIG. 2 is a block diagram of a double pinned perpendicular TMR element.

FIG. 2 is a block diagram of an example double pinned TMR element 200 with free layer biasing. Magnetoresistance element 200 may be similar to magnetoresistance element 100 but may also include bias stack 202. Bias stack 202 may be configured to bias free layer 102 so that, in the absence of an external magnetic field, the magnetic alignment of free layer 102 defaults to a particular direction, e.g., ninety degrees relative to the magnetic direction of the reference stack 104.

Bias stack 202 may include a ferromagnetic layer 204 having a defined magnetic direction (shown by arrow 206)

perpendicular to substrate 108. Bias stack 202 may also include a non-magnetic layer 208 between ferromagnetic layer 204 and free layer 102.

Non-magnetic layer 208 may allow the ferromagnetic layer to weakly magnetically couple to the free layer 102. The weak coupling may cause free layer 102 to adopt (i.e. be biased to) a particular magnetic direction in the absence of an external magnetic field. Also, the weak coupling may allow an external magnetic field to change (i.e. "spin") the magnetic direction of free layer 102 during operation.

The TMR element 200 can be driven with a current that flows between the bottom electrode 213 and the cap 211. Unlike many types of TMR elements, the TMR element 200 can be responsive to external magnetic fields in a direction of the arrow labeled Hext, i.e. perpendicular to the top surface of substrate 108 on which TMR element 208 sits.

Figure 3:
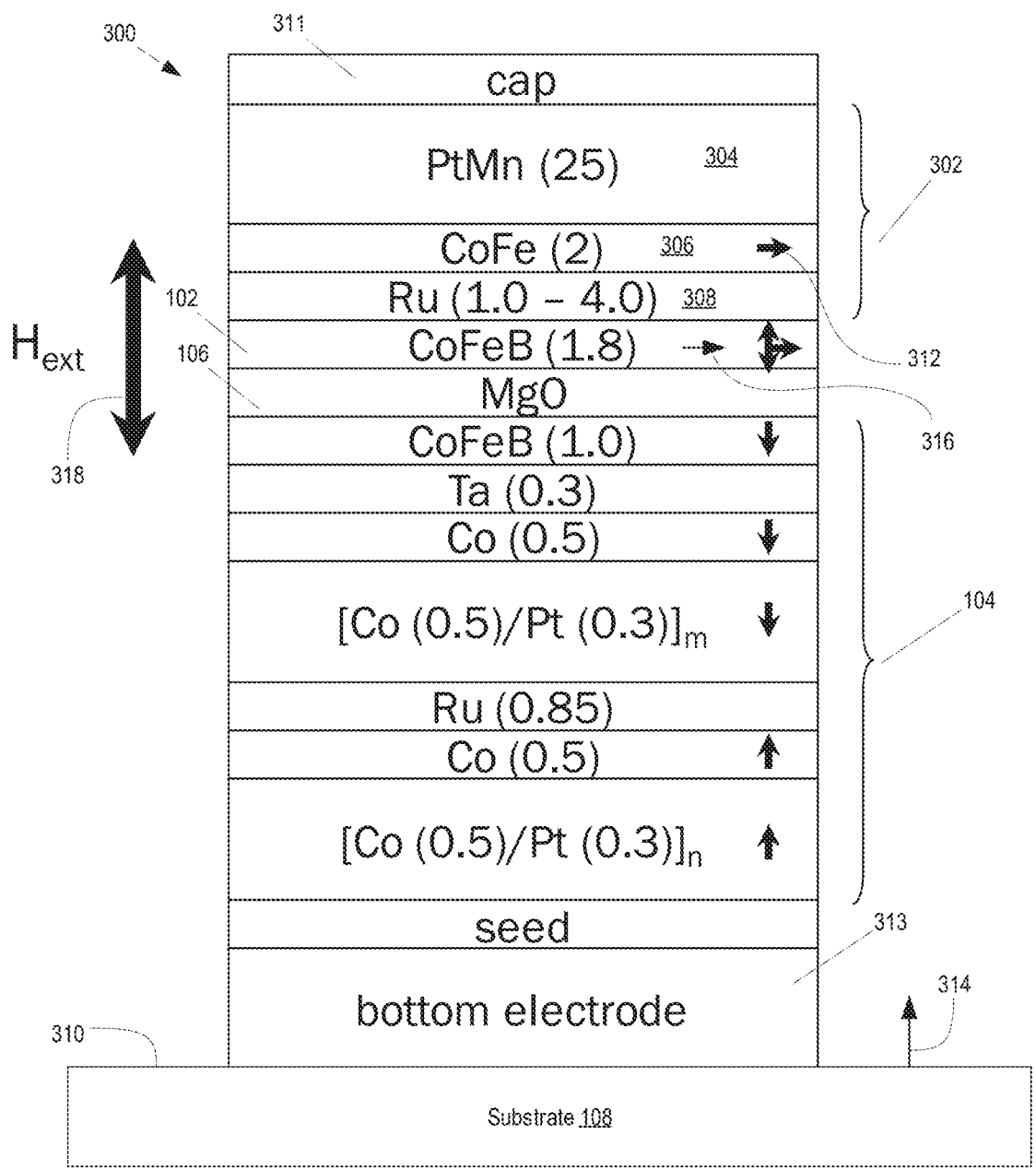
FIG. 3 is a block diagram of a double pinned perpendicular TMR element with orthogonal bias and reference directions.

Referring to FIG. 3, tunneling MR (magnetoresistance) element 300 may include free layer 102, spacer layer 106, and reference stack 104. MR element 300 may also include bias stack 302 having a pinning layer 304, a pinned layer 306, and a spacer layer 308 to allow ferromagnetic coupling between free layer 102 and pinned layer 306. In embodiments, the magnetic coupling between free layer 102 and pinned layer 306 will cause the magnetic direction of free layer 102 to default (e.g. bias) to a fixed direction in the absence of a magnetic field. In embodiments, the thickness of the free layer is relatively thick so that its magnetization will now lie in-plane. Also, the magnetic coupling may be relatively weak so that an external magnetic field can overcome the bias and change the magnetic direction of free layer 102 in response to the external magnetic field.

Surface 310 of substrate 108 (i.e. the surface on which MR element 300 is supported) may define a plane having a normal vector shown by arrow 314. The direction of magnetic alignment of pinned layer 306 may be perpendicular to normal vector 314, as shown by arrow 312. This may cause the magnetic alignment of free layer 102 to be biased in a direction perpendicular to normal vector 314 (i.e. parallel to surface 310), as shown by arrow 316. In other words, in the absence of an external magnetic field, bias stack 302 may bias the magnetic alignment of free layer 102 to a direction perpendicular to normal vector 314.

If external magnetic field 318 is present, magnetic field 318 may cause the magnetic alignment of free layer 102 to change so that, at one extreme, the magnetic alignment of free layer 102 is parallel to and in the direction of normal vector 314 (i.e. pointing away from substrate 108) and, at the other extreme, the magnetic alignment of free layer 102 is opposite to normal vector 314 (i.e. pointing toward substrate 108). As noted above, changing the magnetic alignment of free layer 102 will change the electrical resistance of MR element 300.

To provide a bias direction perpendicular to normal vector 314, bias stack 302 may be designed so that pinned layer 306 has a magnetic alignment perpendicular to normal vector 314. Inn-plane bias may be obtained by using the PtMn layer 304, which may be annealed to create one pinning direction rather than a multitude of directions.

The TMR element 300 can be driven with a current that flows between the bottom electrode 313 and the cap 311. TMR element 300 can be responsive to the amplitude of external magnetic fields in a direction of an arrow labeled Hext. The intra-stack bias may allow for a crossed anisotropy that gives a linear range at around zero field, permitting to measure the perpendicular field amplitude.

Figure 4:
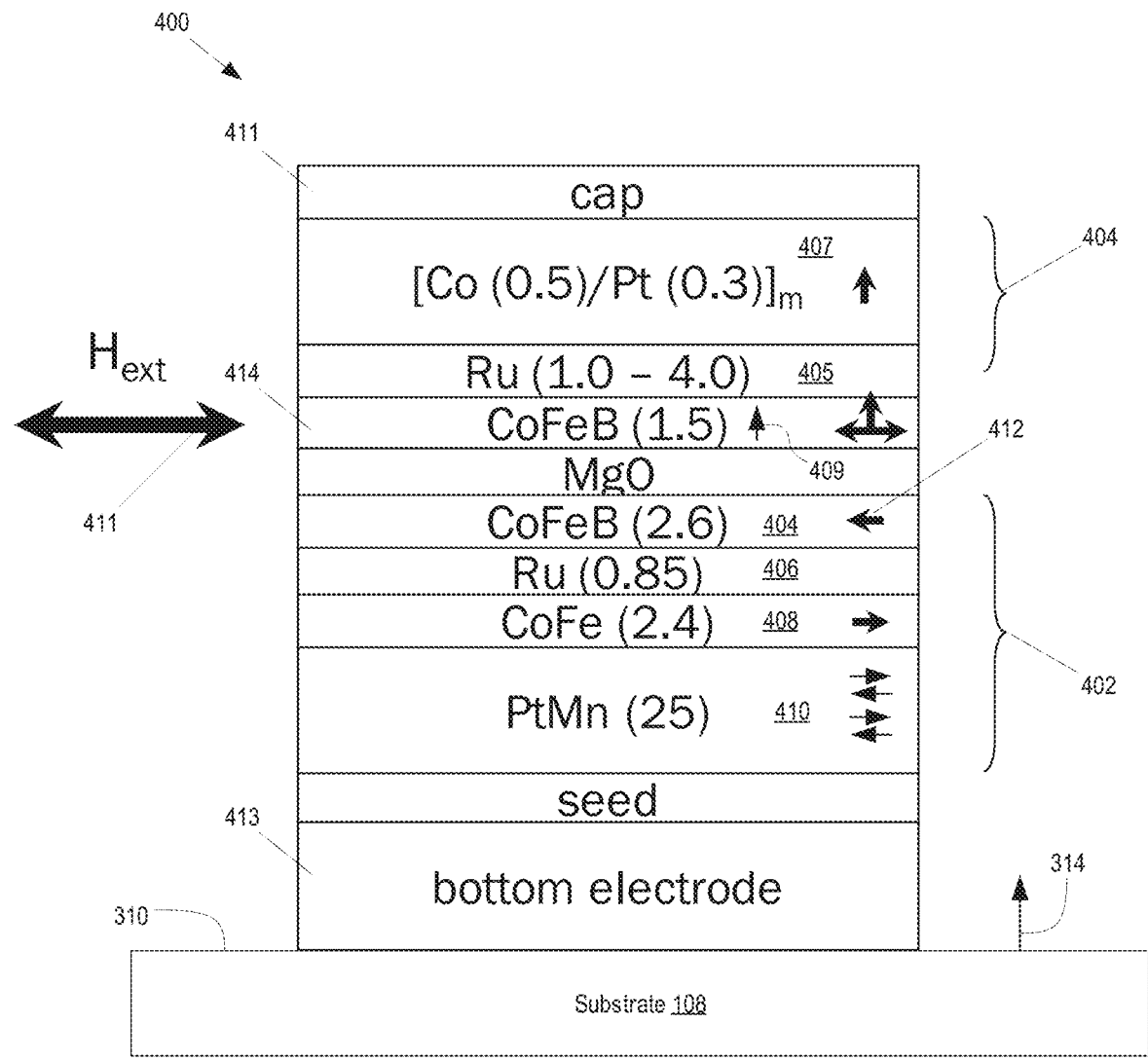
FIG. 4 is a block diagram of a double pinned in-plane tunnel magnetoresistance element with orthogonal bias and reference directions.

FIG. 4 is a block diagram of a tunneling giant MR (magnetoresistance) element 400 having a reference stack 402 with a magnetic alignment parallel to surface 310 of substrate 108 (i.e. perpendicular to normal vector 314). MR element 400 also has a bias stack 404 configured to bias free layer 406 in a direction perpendicular to surface 310 (i.e. parallel to normal vector 314) in the absence of an external magnetic field.

Bias stack 404 includes a spacer layer 405 and a pinning layer 407. Spacer layer 405 may comprise a selected material with a thickness chosen to create a relatively weak ferromagnetic or antiferromagnetic coupling between pinning layer 407 and free layer 414. The coupling may be strong enough to cause the magnetic alignment of free layer 414 to be biased in a direction parallel to and in the same direction as normal vector 314 in the absence of a magnetic field (as shown by arrow 409). The coupling may also be relatively weak so that the magnetic alignment of free layer 414 changes in response to external magnetic field 411.

Reference stack 402 includes pinning layer 410 having multiple internal layers (or crystal structures) with opposing magnetic directions. Pinned layer 410 may define or "pin" the magnetic alignment of layers 404-408.

Ferromagnetic layer 404, spacer layer 406, and ferromagnetic layer 408 may form a synthetic antiferromagnetic (SAF) structure having a magnetic alignment perpendicular to and in the same direction as normal vector 314, as illustrated by arrow 412. The electrical resistance of MR element 400 may be defined by the relative magnetic alignment of free layer 414 and ferromagnetic layer 404. Thus, when free layer 414 is aligned in the same direction as arrow 412, MR element 400 has a small electrical resistance. Conversely, when free layer 414 is aligned in the opposite direction to arrow 414 (e.g. to the right of the page), MR element 400 may have a large electrical resistance.

MR element 400 may be sensitive to magnetic fields like magnetic field 411 that are perpendicular to normal vector 314. For example, magnetic fields that are perpendicular to normal vector 314 may case the magnetic alignment of free layer 414 to change, and thus change the electrical resistance of MR element 400.

The TMR element 400 can be driven with a current that flows between the bottom electrode 413 and the cap 411. The TMR element 400 can be responsive to external magnetic fields in a direction of an arrow labeled Hext.

Figure 5:
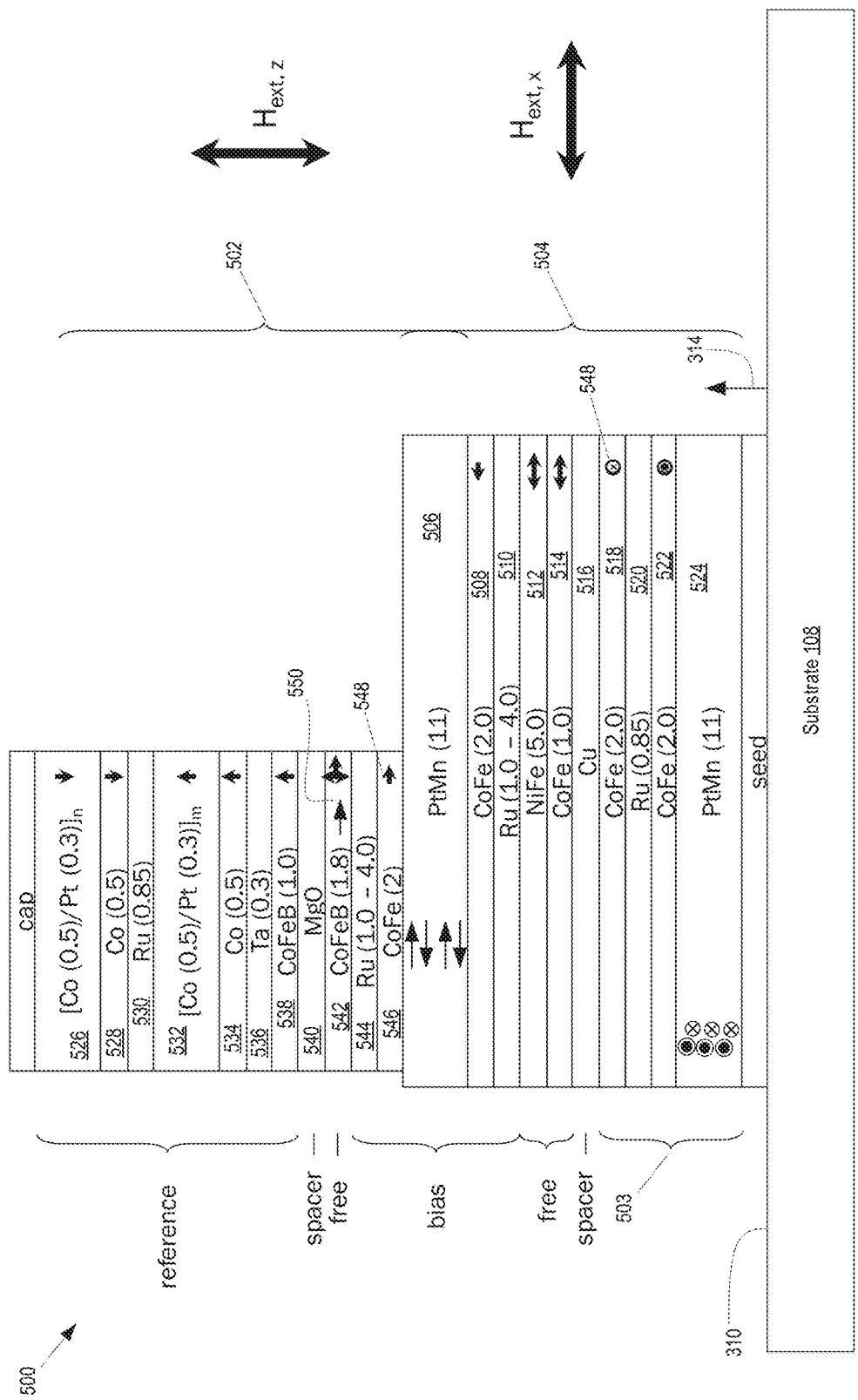
FIG. 5 is a block diagram of a stack comprising a TMR element disposed over a GMR element.

FIG. 5 is a block diagram of an MR stack 500 comprising a first MR element 502 (A TMR element) stacked on top of a second MR element 504 (a GMR element). In this example, MR element 502 has an axis of maximum sensitivity that is substantially perpendicular to the axis of maximum sensitivity of MR element 504. Also, in this example, MR element 502 is a TMR element with an axis if maximum sensitivity parallel to normal vector 314 and MR element 504 is a GMR element with an axis of maximum sensitivity perpendicular to normal vector 314.

In embodiments, MR element 504 has a width in a direction parallel to surface 310 greater than the width of MR element 502.

In embodiments, MR elements 502 and 504 may share one or more layers. In the example shown, MR elements 502 and 504 share pinning layer 506, which may be included in a bias stack in both MR element 502 and MR element 504.

GMR element 504 is configured to have an axis of maximum sensitivity parallel to surface 310 (i.e. perpendicular to normal vector 314). GMR element 504 includes a free layer structure comprising layers 512 and 514, reference stack 503 comprising layers 518-524 and having a fixed reference magnetic alignment, a bias stack comprising layers 506-510 to bias the magnetic alignment of free layers 512 and 514 in the absence of an external magnetic field, and spacer layer 516.

Reference stack 503 includes pinning layer 524 which has multiple, internal layers (or crystal structures) with opposing magnetic alignment. Reference stack 503 also includes an SAF (synthetic antiferromagnet) structure comprising layers 518-522. Pinning layer 524 pins the magnetic alignment of the SAF layers in place to provide a reference magnetic alignment. In this case, layer 518 has a magnetic alignment perpendicular to normal vector 314 and coming out of the page, as illustrated by symbol 548. Thus, when the magnetic alignment of free layers 512 and 514 is in the same direction as symbol 548 (i.e. coming out of the page), GMR element 504 will have a small resistance. When the magnetic alignment of free layers 512 and 514 is in the opposite direction (i.e. going into the page), GMR element 504 will have a large resistance.

As indicated by the symbols shown on each layer, the magnetic alignment of layers 512 and 514 may be into the page (indicated by the dot) or out of the page (indicated by the x) and may rotate between these two alignments in the presence of an external field. The arrow to the right indicates a default magnetic alignment when an external magnetic field is not present.

The GMR element's bias stack, comprising layers 506-510, causes free layers 512 and 514 to adopt a magnetic alignment parallel to that of pinned layer 508 in the absence of an external magnetic field.

TMR element 502 is configured to have an axis of maximum sensitivity perpendicular to surface 310 (i.e. parallel to normal vector 314). TMR element 502 includes a bias stack comprising at least layers 506, 544, and 546; a reference stack comprising layers 526-538; a spacer (insulator) layer 540 and a free layer 542. The reference stack includes a pinning layer 526 and a SAF structure comprising layers 528-532. The pinning layer 526 pins the magnetic alignment of the SAF structure in a direction parallel to normal vector 314. Layers 534-538 form a SAF structure.

TMR element 502 bias structure includes shared pinning layer 506. Pinning layer 506 pins the magnetic alignment of pinned layer 546 in a direction perpendicular to normal vector 314, as shown by arrow 548.

Antiferromagnetic coupling across spacer layer 544 between pinned layer 546 and free layer 542 cause the magnetic alignment of free layer 542 to adopt a direction perpendicular to normal vector 314, e.g. parallel (antiparallel) of the arrow 550, in the absence of an external magnetic field. The Ru spacer layer may be ferromagnetic or antiferromagnetic coupling depending on thickness of the Ru spacer layer.

MR stack 500 may be able to detect a magnetic field in two dimensions. As a magnetic target moves and rotates, its magnetic field vector will also move and rotate. In embodiments, its magnetic field vector can be broken down into a horizontal component $H_{ext,x}$ and a vertical component $H_{ext,z}$. The horizontal component may affect the resistance of GMR element 504 and the vertical component may affect the resistance of TMR element 502. The change in resistances can be monitored by an external circuit or processor (not shown) to determine the state of the magnetic target in relation to the MR elements. Because the two MR elements are sensitive in different directions, a circuit monitoring the resistances of the MR elements may determine position of the target in at least two coordinates (e.g. the horizontal and vertical coordinates shown in FIG. 5).

Figure 6:
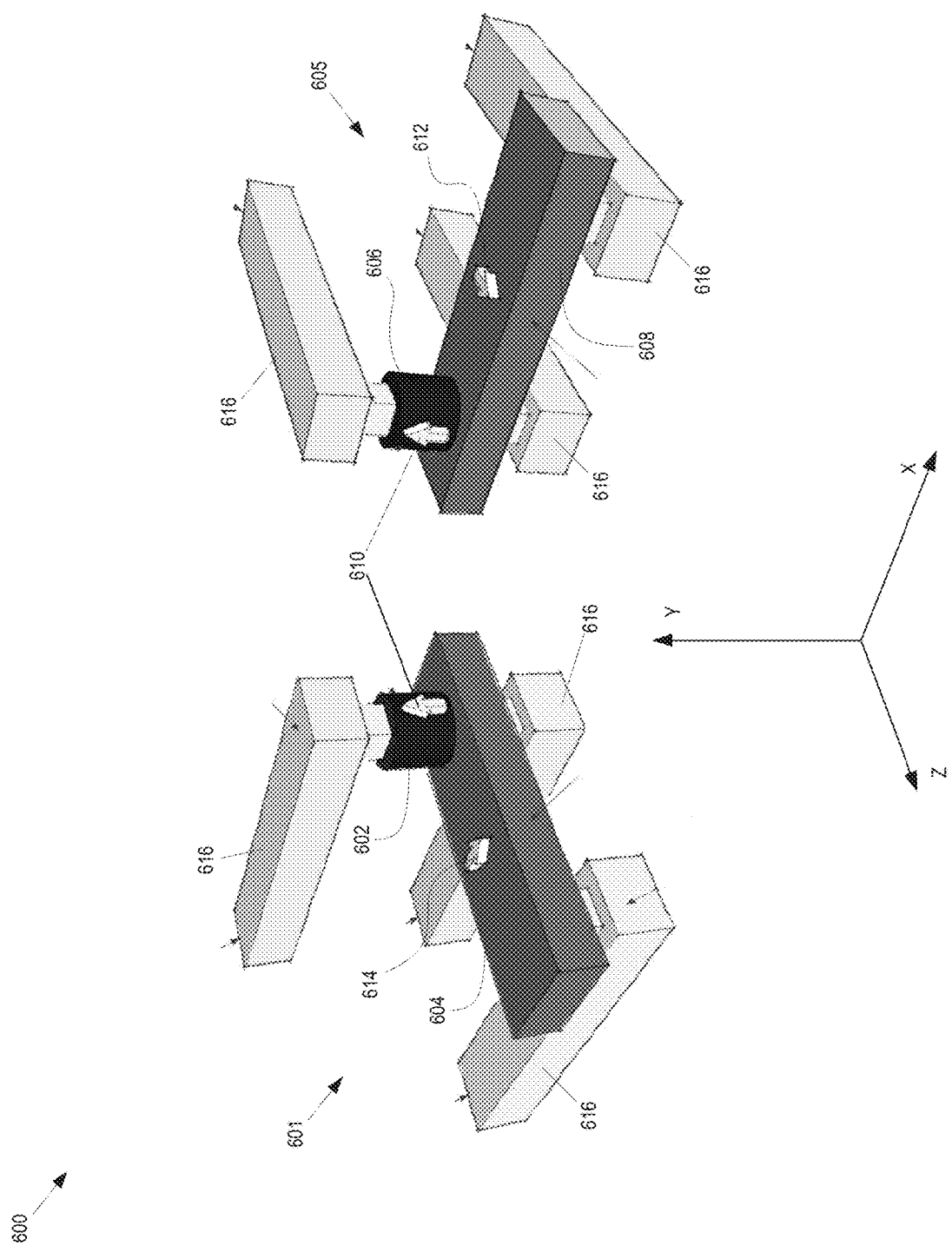
FIG. 6 is an isometric diagram of magnetoresistance elements positioned to detect a magnetic field in three dimensions.

Referring to FIG. 6, additional MR elements may be used to detect a target in three dimensions. In example system 600, two stacked TMR/GMR structures may be used. The first structure 601 comprises TMR element 602 stacked on top of GMR element 604. The second structure 605 comprises TMR element 606 stacked on top of GMR element 608.

Assuming a three-dimensional cartesian coordinate system with X, Y, and Z axes, TMR elements 602 and 606 may be sensitive to magnetic fields in the Y direction as shown by arrows 610. Structure 605 may be positioned so that GMR element 608 is sensitive to magnetic fields in the Z direction (substantially orthogonal to arrows 610), as shown by arrow 612. Structure 601 may be positioned so that GMR element 604 is sensitive to magnetic fields in the X direction (substantially orthogonal to arrows 610 and 612), as shown by arrow 614. If incorporated into a magnetic field sensor, structures 601 and 605 will provide magnetic information in three dimensions. Metal traces 616 (i.e., within metal layers) may provide electrical connections to TMR elements 602 and 606, and GMR elements 604 and 608 for interconnection to external circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims. All references cited herein are hereby incorporated herein by reference in their entirety.

The invention claimed is:

1. A magnetoresistance element comprising:
a free layer;
a bias stack configured to bias a magnetic alignment of the free layer to a first direction in the absence of an external magnetic field; and
a reference stack having a reference direction;
wherein:
the magnetoresistance element is a tunneling magnetoresistance (TMR) element;
the magnetoresistance element is supported on a surface of a substrate; and
the first direction is substantially orthogonal to the surface of the substrate,
wherein the first direction corresponds to a magnetic alignment of the free layer that results in an intermediate electrical resistance of the magnetoresistance element, wherein the first direction is between a second direction that points towards the substrate causing the magnetoresistance element to have a first electrical resistance and a third direction pointing away from the substrate causing the magnetoresistance element to have a second electrical resistance, wherein the intermediate electrical resistance is higher than the first electrical resistance and lower than the second electrical resistance.

2. The magnetoresistance element of claim 1 further comprising a spacer layer between the free layer and the bias stack.

3. A magnetoresistance structure comprising:
a first magnetoresistance element; and
a second magnetoresistance element;
wherein the first magnetoresistance element is formed on a surface of the second magnetoresistance element, the first magnetoresistance element is a tunneling magnetoresistance (TMR) element comprising:
a free layer;
a bias stack configured to bias a magnetic alignment of the free layer to a first direction in the absence of an external magnetic field; and
a reference stack having a reference direction substantially orthogonal to the first direction,
wherein the second magnetoresistance element has a width greater than the width of the first magnetoresistance element.

4. The magnetoresistance structure of claim 3 wherein the second magnetoresistance element comprises:
a second free layer;
a second bias stack configured to bias a magnetic alignment of the second free layer to a second direction in the absence of an external magnetic field; and
a reference stack having a second reference direction substantially orthogonal to the second direction.

5. The magnetoresistance structure of claim 4 wherein the first direction and the second direction are substantially perpendicular.

6. The magnetoresistance structure of claim 4 wherein the reference direction and the second reference direction are substantially perpendicular.

7. The magnetoresistance structure of claim 4 wherein the second magnetoresistance element is a giant magnetoresistance (GMR) element.

8. The magnetoresistance structure of claim 4 further comprising a substrate supporting the first and second magnetoresistance elements on a surface of the substrate, wherein the reference direction is substantially perpendicular to the surface and the second reference direction is substantially parallel to the surface.

9. The magnetoresistance structure of claim 8 wherein the first direction is substantially parallel to the surface.

10. The magnetoresistance structure of claim 3 wherein at least one material layer is shared between the first and second magnetoresistance elements.

11. A three-dimensional magnetic field sensor comprising:
a substrate having a surface;
a first magnetoresistance structure supported by the surface of the substrate, the first magnetoresistance structure comprising:
a first magnetoresistance element having an axis of maximum sensitivity substantially perpendicular to the surface; and
a second magnetoresistance element having an axis of maximum sensitivity substantially parallel to the surface; and
a second magnetoresistance structure supported by the surface of the substrate, the second magnetoresistance structure comprising:
a third magnetoresistance element having an axis of maximum sensitivity substantially perpendicular to the surface; and
a fourth magnetoresistance element having an axis of maximum sensitivity substantially parallel to the surface;
wherein the first and second magnetoresistance structures are positioned on the substrate so that the axis of maximum sensitivity of the fourth magnetoresistance element is substantially perpendicular to the axis of maximum sensitivity of the second magnetoresistance element.

12. The three-dimensional magnetic field sensor of claim 11 wherein the first magnetoresistance element is formed on a top surface of the second magnetoresistance element.

13. The three-dimensional magnetic field sensor of claim 11 wherein the third magnetoresistance element is formed on a top surface of the fourth magnetoresistance element.

14. The three-dimensional magnetic field sensor of claim 11 wherein the first and third magnetoresistance elements are tunneling magnetoresistance (TMR) elements.

15. The three-dimensional magnetic field sensor of claim 11 wherein the second and fourth magnetoresistance elements are giant magnetoresistance (GMR) elements.

16. A magnetoresistance element comprising:
a free layer;
a bias stack configured to bias a magnetic alignment of the free layer to a first direction in the absence of an external magnetic field; and
a reference stack having a reference direction;
wherein:
the magnetoresistance element is a giant magnetoresistance (GMR) element;
the magnetoresistance element is supported on a surface of a substrate; and
the first direction is substantially parallel to a surface of a substrate upon which the GMR element is supported,
wherein the first direction corresponds to a magnetic alignment of the free layer that results in an intermediate electrical resistance of the magnetoresistance element, wherein the first direction is between a second direction that points towards the substrate causing the magnetoresistance element to have a first electrical resistance and a third direction pointing away from the substrate causing the magnetoresistance element to have a second electrical resistance, wherein the intermediate electrical resistance is higher than the first electrical resistance and lower than the second electrical resistance.

17. The magnetoresistance element of claim 16 further comprising a spacer layer between the free layer and the reference stack.

18. The magnetoresistance element of claim 17 wherein the spacer layer provides one of ferromagnetic or antiferromagnetic coupling.

19. The magnetoresistance element of claim 16 wherein the magnetoresistance element is a spin valve.

20. A spin valve comprising:
a free layer;
a bias stack configured to bias a magnetic alignment of the free layer to a first direction in the absence of an external magnetic field; and
a reference stack having a reference direction;
wherein:
the spin valve is supported on a surface of a substrate; and
the first direction is substantially orthogonal to the surface of the substrate,
wherein the first direction corresponds to a magnetic alignment of the free layer that results in an intermediate electrical resistance of the magnetoresistance element, wherein the first direction is between a second direction that points towards the substrate causing the magnetoresistance element to have a first electrical resistance and a third direction pointing away from the substrate causing the magnetoresistance element to have a second electrical resistance, wherein the intermediate electrical resistance is higher than the first electrical resistance and lower than the second electrical resistance.

21. The spin valve of claim 20 further comprising a spacer layer between the free layer and the bias stack.

22. The spin valve of claim 20 wherein the spin valve is a tunneling magnetoresistance (TMR) element.

23. The spin valve of claim 20 wherein the spin valve is a giant magnetoresistance (GMR) element.

* * * * *

UNITED STATES PATENT AND TRADEMARK OFFICE
CERTIFICATE OF CORRECTION

PATENT NO. : 10,753,989 B2
APPLICATION NO. : 16/113321
DATED : August 25, 2020
INVENTOR(S) : Paolo Campiglio et al.

It is certified that error appears in the above-identified patent and that said Letters Patent is hereby corrected as shown below:

In the Specification

Column 2, Line 17, delete "dimensions" and replace with --dimensions.--.

Column 2, Line 42, delete "GMR" and replace with --giant magnetoresistance (GMR)--.

Column 3, Line 59, delete "(e.g." and replace with --(e.g.,--.

Column 3, Line 60, delete "(e.g." and replace with --(e.g.,--.

Column 4, Line 21, "(e.g." and replace with --(e.g.,--.

Column 4, Line 39, delete "a SAF" and replace with --an SAF--.

Column 4, Line 50, delete "(e.g." and replace with --(e.g.,--.

Column 5, Line 6, delete "(i.e." and replace with --(i.e.,--.

Column 5, Line 9, delete "(i.e." and replace with --(i.e.,--.

Column 5, Line 15, delete "i.e." and replace with --i.e.,--.

Column 5, Line 25, delete "(e.g." and replace with --(e.g.,--.

Column 5, Line 32, delete "(i.e." and replace with --(i.e.,--.

Column 5, Line 38, delete "(i.e." and replace with --(i.e.,--.

Column 5, Line 47, delete "(i.e." and replace with --(i.e.,--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,753,989 B2

Column 5, Line 49, delete "(i.e." and replace with --(i.e.,--.

Column 5, Line 56, delete "Inn-plane" and replace with --In-plane--.

Column 6, Line 2, delete "(i.e." and replace with --(i.e.,--.

Column 6, Line 4, delete "(i.e." and replace with --(i.e.,--.

Column 6, Line 33, delete "414 (e.g." and replace with --412 (e.g.,--.

Column 6, Line 38, delete "case" and replace with --cause--.

Column 6, Line 46, delete "(A TMR" and replace with --(a TMR--.

Column 6, Line 51, delete "if" and replace with --of--.

Column 6, Line 63, delete "(i.e." and replace with --(i.e.,--.

Column 7, Line 14, delete "(i.e." and replace with --(i.e.,--.

Column 7, Line 18, delete "(i.e." and replace with --(i.e.,--.

Column 7, Line 32, delete "(i.e." and replace with --(i.e.,--.

Column 7, Line 37, delete "a SAF" and replace with --an SAF--.

Column 7, Line 40, delete "a SAF" and replace with --an SAF--.

Column 7, Line 48, delete "e.g." and replace with --e.g.,--.

Column 7, Line 66, delete "(e.g." and replace with --(e.g.,--.

In the Claims

Column 8, Line 50, Claim 1 delete "electrical".